United States Patent
Ishizaka

(10) Patent No.: US 9,932,669 B2
(45) Date of Patent: Apr. 3, 2018

(54) METAL NANODOT FORMATION METHOD, METAL NANODOT FORMATION APPARATUS AND SEMICONDUCTOR DEVICE MANUFACTURING METHOD

(71) Applicant: TOKYO ELECTRON LIMITED, Tokyo (JP)

(72) Inventor: Tadahiro Ishizaka, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/157,599

(22) Filed: May 18, 2016

(65) Prior Publication Data

US 2016/0343817 A1  Nov. 24, 2016

(30) Foreign Application Priority Data

May 21, 2015  (JP) .................................. 2015-103803

(51) Int. Cl.
*H01L 21/28* (2006.01)
*C23C 16/16* (2006.01)
(Continued)

(52) U.S. Cl.
CPC ........ *C23C 16/16* (2013.01); *H01L 21/28273* (2013.01); *H01L 27/11524* (2013.01); *H01L 27/11556* (2013.01); *H01L 29/42332* (2013.01)

(58) Field of Classification Search
CPC ........ H01L 21/28273; H01L 27/11524; H01L 27/11556; C23C 16/16
See application file for complete search history.

(56) References Cited

U.S. PATENT DOCUMENTS

| 7,482,269 B2 | 1/2009 | Suzuki |
| 8,228,743 B2 | 7/2012 | Min et al. |

(Continued)

FOREIGN PATENT DOCUMENTS

| JP | 2008-514814 A | 5/2005 |
| JP | 2010-212601 A | 9/2010 |

OTHER PUBLICATIONS

S. Babar, et al. "Growth Inhibitor to Homogenize Nucleation and Obtain Smooth HfB2 Thin Films by Chemical Vapor Deposition" Chemistry of Materials 2013, 25, p. 662-667.

*Primary Examiner* — Julia Slutsker
(74) *Attorney, Agent, or Firm* — Nath, Goldberg & Meyer; Jerald L. Meyer

(57) ABSTRACT

A metal nanodot formation method includes: loading a target substrate inside a processing container of a processing apparatus; depositing a plurality of metal nanodots on a surface of the target substrate by a sequence of: supplying a CO gas from a CO gas container which stores the CO gas into a raw material container which stores a metal carbonyl compound; generating gas of the metal carbonyl compound; introducing the generated gas of the metal carbonyl compound as a mixture gas containing the CO gas into the processing container; and decomposing the metal carbonyl compound on the target substrate, and directly introducing the CO gas from the CO gas container into the processing container, in a state where the introduction of the mixture gas into the processing container is stopped, such that the CO gas is brought into contact with the metal nanodots on the surface of the target substrate.

9 Claims, 15 Drawing Sheets

(51) Int. Cl.
*H01L 29/423* (2006.01)
*H01L 27/11524* (2017.01)
*H01L 27/11556* (2017.01)

(56) References Cited

U.S. PATENT DOCUMENTS

| | | |
|---|---|---|
| 8,263,465 B2 | 9/2012 | Purayath et al. |
| 8,772,856 B2 | 7/2014 | Ramaswamy |
| 8,822,288 B2 | 9/2014 | Purayath et al. |
| 2006/0062902 A1* | 3/2006 | Sager ............... B22F 1/0018 427/74 |
| 2009/0011585 A1* | 1/2009 | Marsh ............... B82Y 10/00 438/591 |
| 2011/0263123 A1* | 10/2011 | Gomi ............... C23C 16/16 438/681 |
| 2012/0107503 A1 | 5/2012 | Abelson et al. |

\* cited by examiner

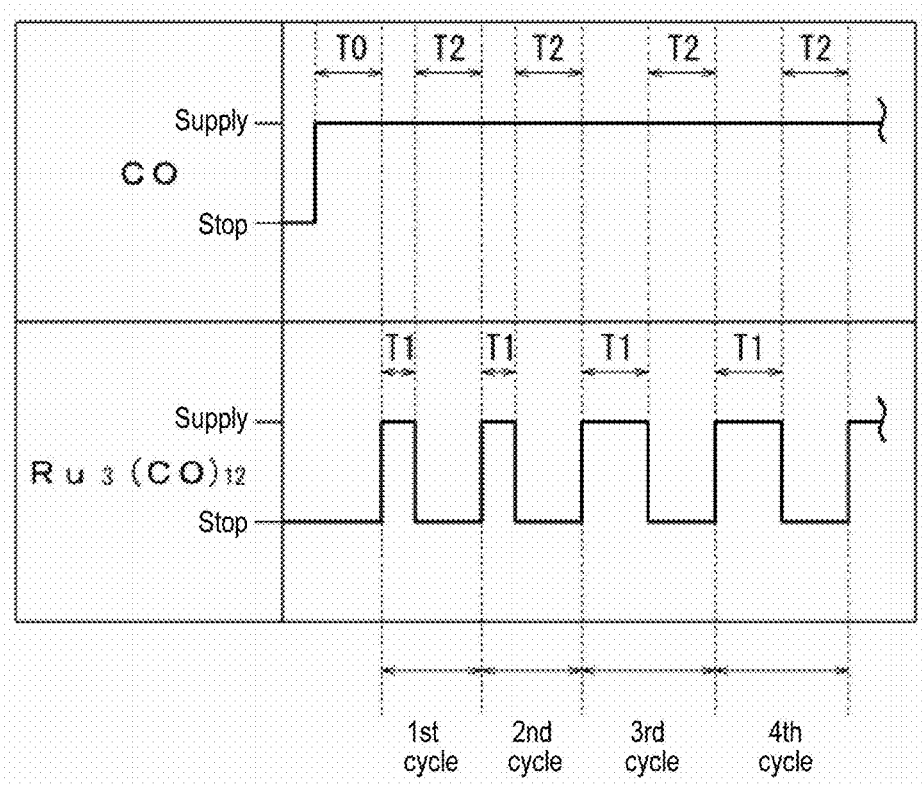

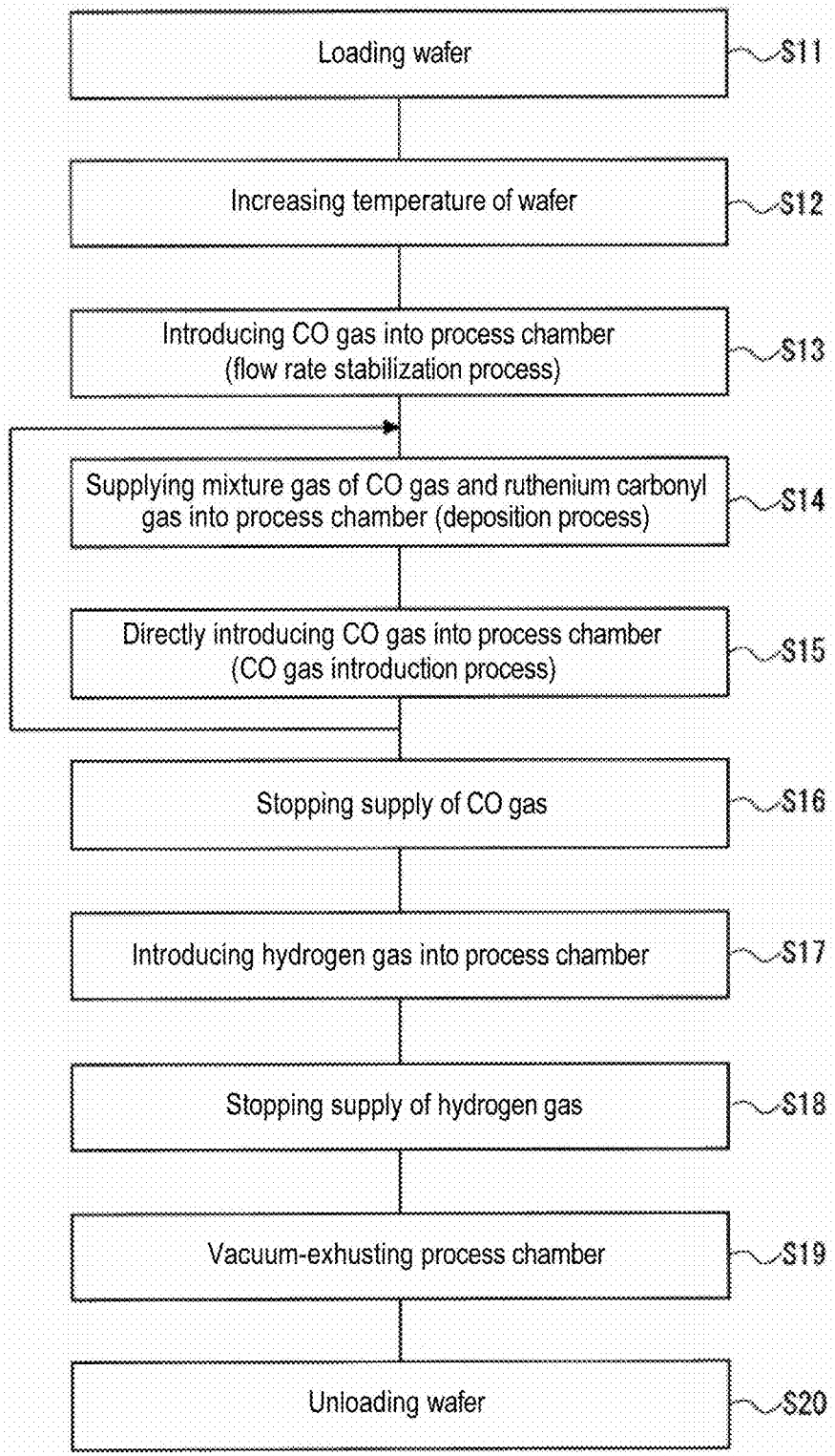

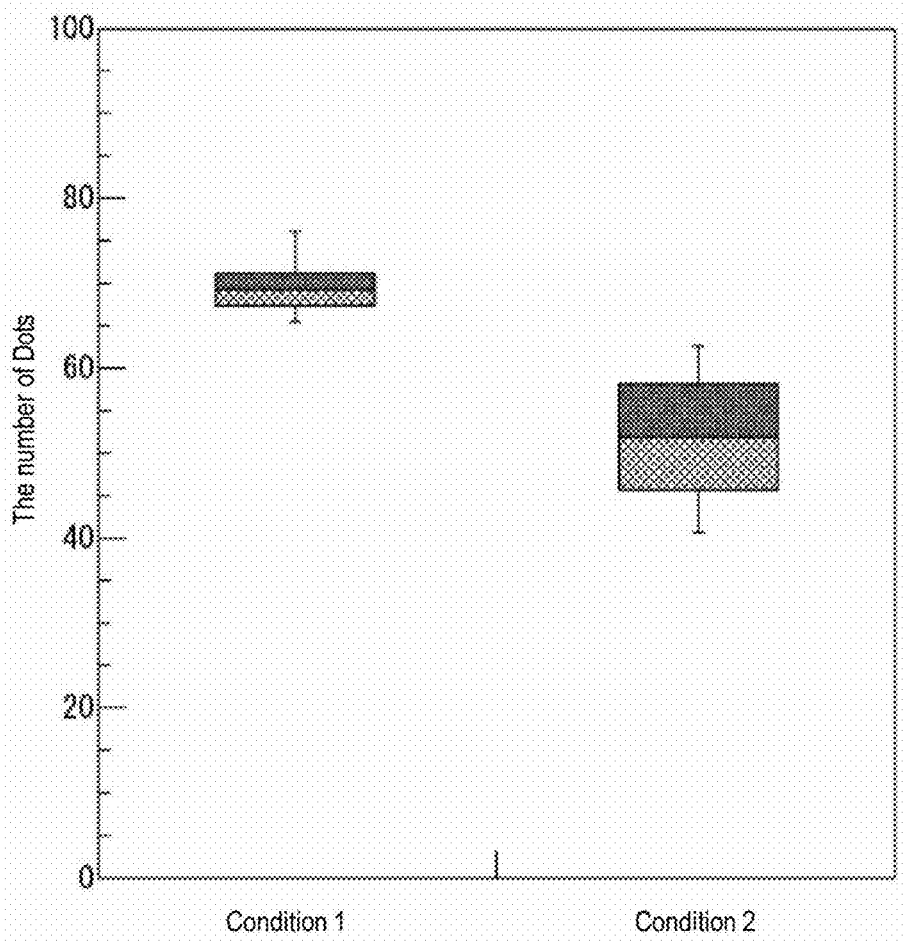

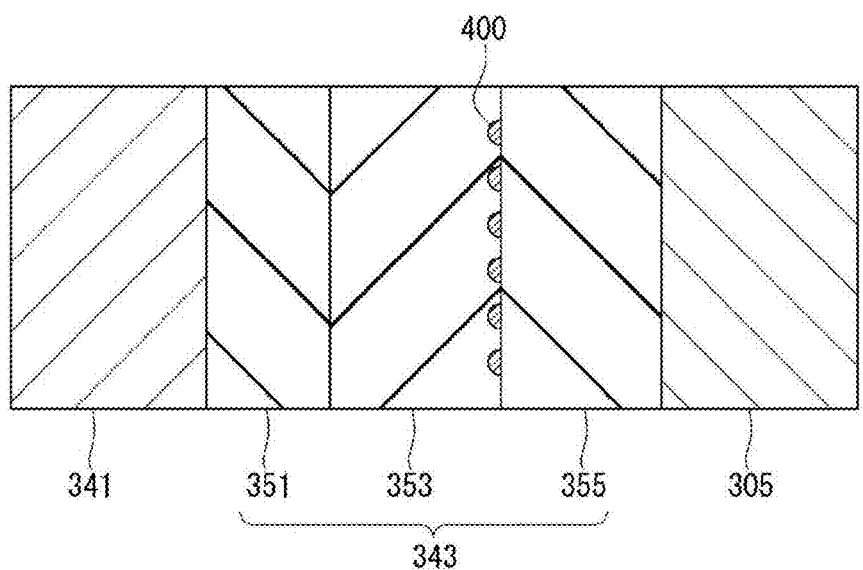

METAL NANODOT FORMATION METHOD, METAL NANODOT FORMATION APPARATUS AND SEMICONDUCTOR DEVICE MANUFACTURING METHOD

CROSS-REFERENCE TO RELATED APPLICATION

This application claims the benefit of Japanese Patent Application No. 2015-103803, filed on May 21, 2015, in the Japan Patent Office, the disclosure of which is incorporated herein in its entirety by reference.

TECHNICAL FIELD

The present disclosure relates to a metal nanodot formation method and apparatus which can be used for, for example, a semiconductor memory device, and a semiconductor device manufacturing method.

BACKGROUND

In recent years, with the ever expending commercial market of portable terminals such as smartphones, tablets or the like, demand for a semiconductor memory device such as a flash memory is on the rise, and an increase in volume of recorded data is also progressing. Miniaturization of the semiconductor memory device is indispensable to the high-capacity of the device. With the progress of miniaturization of the semiconductor memory device, for example, in a flash memory having a floating gate (FG) structure, the number of electric charges accumulated in the FG has been decreased up to a level of 100 or less. As such, if a slight defect exists in a tunnel insulation film, the electric charges may be drawn from the FG through the defect, which causes leakage of data. To address this, there is suggested a structure in which a plurality of nanodots is formed in an electric charge accumulation layer. In such a structure, since the electric charges are accumulated in each of the discrete nanodots, the accumulated electric charges are hardly drawn out, thus reducing the leakage of data. In the structure, the plurality of nanodots is formed on an insulation film by a self-alignment process.

On the other hand, as a typical method for forming wirings, electrodes or the like of a semiconductor device, a CVD (chemical vapor deposition) method is known. As a technique for forming a metal film using the CVD method, there is suggested a method which uses a ruthenium carbonyl ($Ru_3(CO)_{12}$) as a film-forming raw material, an argon gas as a carrier gas, and a hydrogen gas as a reduction gas. In addition, there is suggested another method which uses a ruthenium carbonyl as a film-forming raw material, and a carbon monoxide (CO) as a carrier gas. In a reaction system using the ruthenium carbonyl and the carbon monoxide, since impurity components included in the film-forming raw material are basically restricted as carbon and oxygen, it is possible to obtain a highly purified film. Also, there is suggested yet another method which uses a ruthenium carbonyl as a film-forming raw material, and performs an annealing process under a hydrogen-containing atmosphere after the film-forming process, thus reducing residual carbons in the film.

In addition, in forming a thin film using the CVD method, there is suggested a technique which adds an inhibitor such as ammonia or the like. In such a method, the inhibitor allows nuclei to be uniformly formed during a growth process of a thin film such as $HfB_2$ film, thus obtaining a smooth thin film.

As mentioned above, in recent years, design rules of semiconductor devices are increasingly miniaturized. For example, nanodots used in a flash memory are increasingly required to be finely and evenly formed. In the conventional methods, although the plurality of nanodots is formed on the insulation film by the self-alignment process, if fine nanodots can be formed by the CVD method as a relatively general method, it is possible to decrease the number of processes, thus providing a wider range of applications.

SUMMARY

Some embodiments of the present disclosure provide a method for forming fine metal nanodots with a substantially uniform distribution using a CVD method.

According to one embodiment of the present disclosure, there is provided a metal nanodot formation method, including: loading a target substrate inside a processing container of a processing apparatus; depositing a plurality of metal nanodots on a surface of the target substrate by a sequence of: supplying a CO gas from a CO gas container which stores the CO gas as a carrier gas into a raw material container which stores a metal carbonyl compound as a solid raw material; generating gas of the metal carbonyl compound; introducing the generated gas of the metal carbonyl compound as a mixture gas containing the CO gas into the processing container; and decomposing the metal carbonyl compound on the target substrate, and directly introducing the CO gas from the CO gas container into the processing container, in a state where the introduction of the mixture gas into the processing container is stopped, such that the CO gas is brought into contact with the metal nanodots on the surface of the target substrate.

According to another embodiment of the present disclosure, there is provided a metal nanodot formation apparatus, including: a processing container configured to receive a target substrate; a raw material container configured to store a metal carbonyl compound as a solid raw material; a CO gas container configured to store a CO gas, a raw material gas supply path through which gas of the metal carbonyl compound generated by introducing the CO gas as a carrier gas into the raw material container, is introduced into the processing container, as a mixture gas containing the CO gas; a CO gas supply path through which the CO gas supplied from the CO gas container is directly introduced into the processing container, without passing through the raw material container; and a controller configured to control a metal nanodot formation process to be performed inside the processing container by a chemical vapor deposition method. The controller switches the introduction of the mixture gas into the processing container via the raw material gas supply path, and the direct introduction of the CO gas into the processing container via the CO gas supply path, to execute: a deposition process of introducing the mixture gas into the processing container via the raw material gas supply path, decomposing the metal carbonyl compound on the target substrate, and depositing a plurality of metal nanodots on a surface of the target substrate, and a CO gas introduction process of directly introducing the CO gas from the CO gas container into the processing container via the CO gas supply path, in a state where the introduction of the mixture gas into the processing container is stopped, such that the CO gas is brought into contact with the metal nanodots on the surface of the target substrate.

According to yet another embodiment of the present disclosure, there is provided a method for manufacturing a semiconductor device, which includes forming metal nanodots using the aforementioned metal nanodot formation method.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIG. 7 is yet another example of a timing chart showing a sequence of supply and cutoff operations of a CO gas and a ruthenium carbonyl gas when a deposition process and a CO gas introduction process are repeated.

FIG. 8 is a flowchart showing an example of a sequence of a metal nanodot formation method according to a second embodiment of the present disclosure.

FIG. 9 is a graph showing a variation in number of Ru nanodots formed in an Example of the present disclosure and Comparative example.

FIG. 19 is a partly enlarged view of FIG. 18.

DETAILED DESCRIPTION

Reference will now be made in detail to various embodiments, examples of which are shown in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, sequences, systems, and components have not been described in detail so as not to unnecessarily obscure aspects of the various embodiments.

Figure 1:
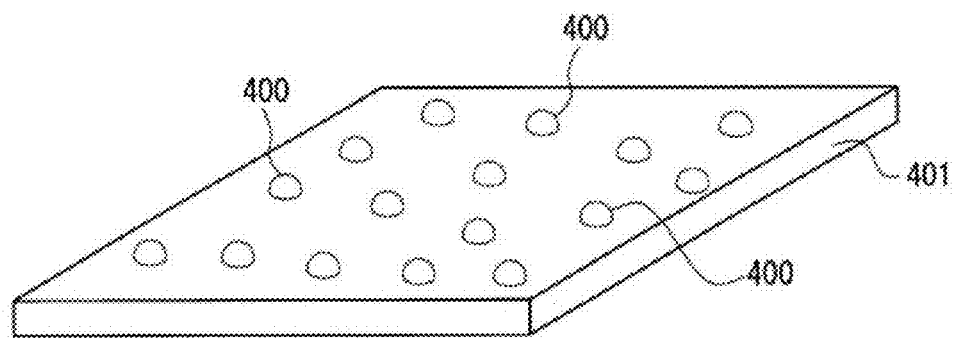
FIG. 1 is a view explaining metal nanodots formed by a metal nanodot formation method according to one embodiment of the present disclosure.

A metal nanodot formation method according to the present disclosure in some embodiments, for example, as shown in FIG. 1, can form a plurality of metal nanodots 400 on a base film 401 such as an insulation film in a two-dimensional distribution pattern.

<Metal Carbonyl Compound>

In one embodiment, examples of a metal species constituting the metal nanodots 400 are not particularly restricted as long as they can form a metal carbonyl compound. Examples of the metal carbonyl compound are not particularly restricted but may include the following compounds, for example:

Tri-ruthenium dodecacarbonyl $[Ru_3(CO)_{12}]$
Tantalum hexacarbonyl $[Ta(CO)_6]$
Tungsten hexacarbonyl $[W(CO)_6]$
Ditechnetium decacarbonyl $[Tc_2(CO)_{10}]$
Pentacarbonyliron $[Fe(CO)_5]$
Nonacarbonyldiiron $[Fe_2(CO)_9]$
Dodecacarbonyltriiron $[Fe_3(CO)_{12}]$
Dicobalt octacarbonyl $[Co_2(CO)_8]$
Tetracobalt dodecacarbonyl $[Co_4(CO)_{12}]$
Tetrairidium dodecacarbonyl $[Ir_4(CO)_{12}]$
Nickel tetracarbonyl $[Ni(CO)_4]$ The following description will be made on an example in which Ru nanodots as the metal nanodots 400 are formed using the tri-ruthenium dodecacarbonyl $Ru_3(CO)_{12}$ (hereinafter sometimes simply referred to as "ruthenium carbonyl") as the metal carbonyl compound.

<Metal Nanodot Formation Apparatus>

Figure 2:
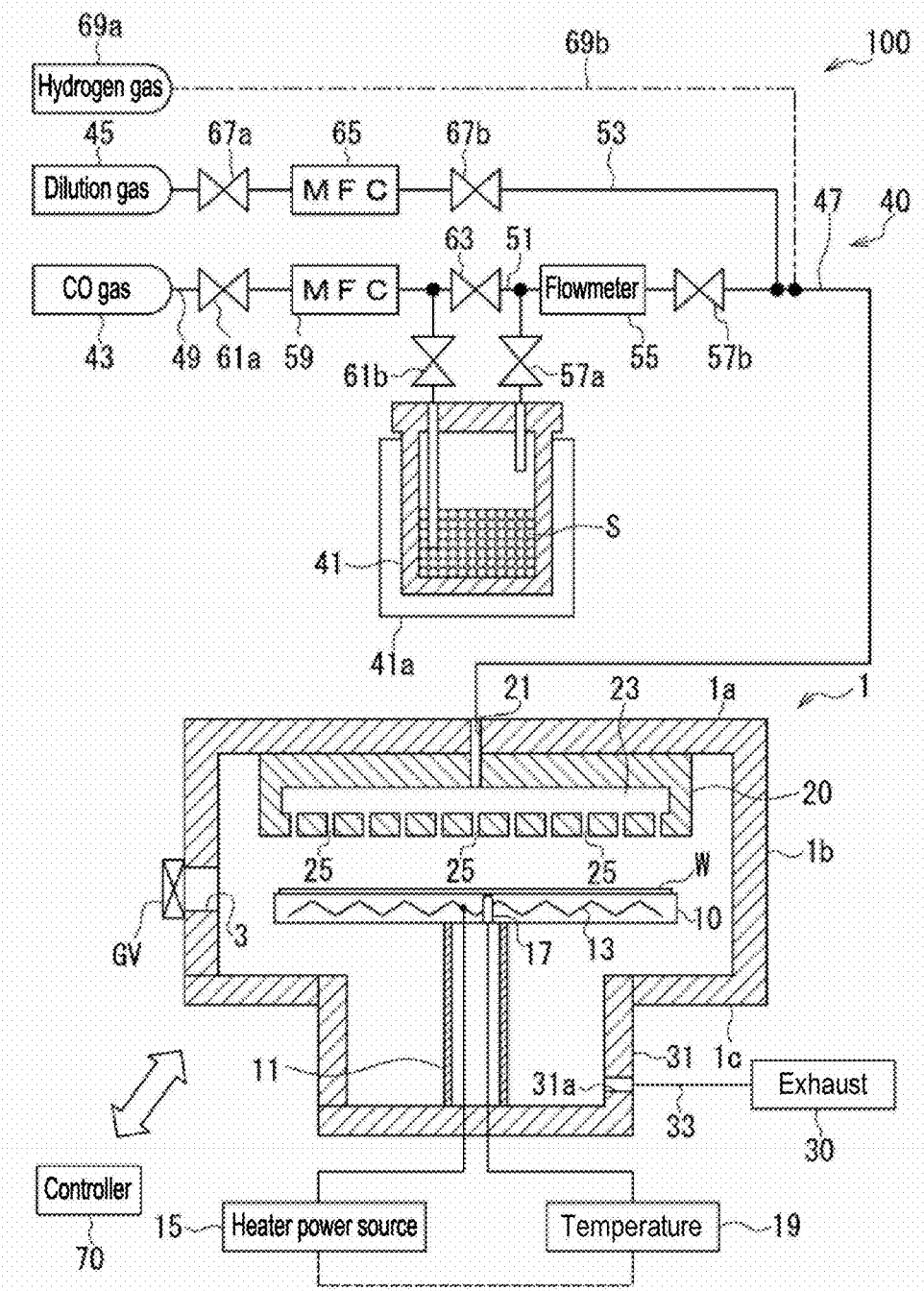
FIG. 2 is a cross-sectional view showing a metal nanodot formation apparatus according to one embodiment of the present disclosure.

FIG. 2 is a cross-sectional view showing a schematic configuration of a metal nanodot formation apparatus 100 according to one embodiment of the present disclosure. The metal nanodot formation apparatus 100 is to form Ru nanodots on a surface of a semiconductor wafer (hereinafter sometimes simply referred to as "wafer") as a target substrate by a CVD method, using the ruthenium carbonyl compound as a raw material.

The metal nanodot formation apparatus 100 includes an air-tight sealed processing container 1, a susceptor 10 as a mounting table configured to support a wafer W inside the processing container 1 in a horizontal posture, a shower head 20 configured to introduce a process gas for forming the Ru nanodots by the CVD method into the processing container 1 in the form of showers, an exhaust device 30 configured to keep the interior of the processing container 1 in a predetermined depressurized (or vacuumed) state, a gas supply part 40 configured to supply the process gas for forming the Ru nanodots by the CVD method into the processing container 1, and a controller 70 configured to control respective parts of the metal nanodot formation apparatus 100.

<Processing Container>

The processing container 1 is of a cylindrical shape and includes a top wall 1a, a side wall 1b and a bottom wall 1c. A transfer port 3 as an opening is formed in the side wall 1b of the processing container 1. Through the transfer port 3, the wafer W is transferred between the processing container 1 and a transfer chamber (not shown) which is kept in a predetermined depressurized state. The transfer port is opened and closed by a gate valve GV.

<Susceptor>

The susceptor 10 is supported by a cylindrical support member 11 which is installed at the center of the bottom wall 1c of the processing container 1. For example, a resistance heating type of heater 13 is embedded in the susceptor 10. The heater 13 is connected to a heater power source 15. Further, the susceptor 10 includes a thermocouple 17 installed therein. The thermocouple 17 is connected to a temperature measuring part 19. The temperature measuring part 19 measures a temperature of the susceptor 10 based on a signal detected at the thermocouple 17 of the susceptor 10. By controlling the heater power source 15 based on measured temperature, a temperature of the wafer W is adjusted to a predetermined temperature via the susceptor 10. In addition, three lifting pins (not shown) for moving the wafer W up and down while supporting the wafer W are installed in the susceptor 10 such that the lifting pins can protrude and retract with respect to the surface of the susceptor 10.

<Shower Head>

The shower head 20 is installed in the top wall 1a of the processing container 1 to introduce the process gas for forming the Ru nanodots by the CVD method into the processing container 1. The shower head 20 is installed to face the susceptor 10. The shower head 20 discharges the gas supplied from the gas supply part 40 into the processing container 1 in the form of showers. In the substantial center of an upper portion of the shower head 20, a gas inlet 21 is formed to introduce the gas therethrough. In addition, a gas diffusion space 23 is defined inside the shower head 20. A plurality of gas discharge holes 25 is formed in a bottom surface of the shower head 20. These gas discharge holes 25 are in communication with the gas diffusion space 23.

<Exhaust Device>

The exhaust device 30 includes a vacuum pump, a pressure control valve and the like which are not shown, to keep the interior of the processing container 1 in a predetermined depressurized (or vacuumed) state. A downwardly protruded exhaust chamber 31 is installed in the bottom wall 1c of the processing container 1. The exhaust chamber 31 is connected to an exhaust pipe 33 at its side surface via an exhaust port 31a. The exhaust pipe 33 is connected to the exhaust device 30. The interior of the processing container 1 is configured to be kept in the predetermined depressurized (or vacuumed) state with the operation of the exhaust device 30. Further, the exhaust device 30 is connected to a pressure gauge part (not shown) configured to measure an internal pressure of the processing container 1. The internal pressure of the processing container can be controlled by adjusting an exhaust amount of gas based on the pressure measured at the pressure gauge part.

<Gas Supply Part>

The gas supply part 40 includes a raw material container 41 which stores the ruthenium carbonyl as a solid raw material S, a CO gas container 43 which stores a CO gas, and a dilution gas container 45 which stores a dilution gas. In addition, the gas supply part 40 includes a raw material gas supply pipe 47 through which a raw material gas containing the ruthenium carbonyl is supplied from the raw material container 41 into the processing container 1, a CO gas supply pipe 49 through which the CO gas is supplied from the CO gas container 43 into the raw material container 41, a bypass pipe 51 connected to the raw material gas supply pipe 47 and the CO gas supply pipe 49, and a dilution gas supply pipe 53 through which the dilution gas is supplied from the dilution gas container 45 into the processing container 1 via the raw material gas supply pipe 47.

<Raw Material Container>

The raw material container 41 stores the ruthenium carbonyl as the solid raw material S. For example, a jacket type heater 41a is installed around the raw material container 41 to heat the solid ruthenium carbonyl to a predetermined temperature.

<CO Gas Container>

The CO gas container 43 which stores the CO gas is connected to the CO gas supply pipe 49. The CO gas acts as a carrier gas for supplying a ruthenium carbonyl gas generated from the solid ruthenium carbonyl to the processing container 1.

<Dilution Gas Container>

The dilution gas container 45 stores the dilution gas for diluting the raw material gas. Examples of the dilution gas may include a nobble gas represented by Ar gas, an inert gas such as $N_2$ gas or the like. In addition, the dilution gas may also be used as a purge gas for purging a residual gas inside the raw material gas supply pipe 47 and the processing container 1.

<Raw Material Gas Supply Pipe>

One end of the raw material gas supply pipe 47 is connected into the raw material container 41, and the other end thereof is connected to the gas inlet 21 of the shower head 20. In the raw material gas supply pipe 47, there are installed a flowmeter 55 configured to measure a flow rate of the ruthenium carbonyl gas, and valves 57a and 57b which are respectively positioned at upstream and downstream sides in a gas flow direction with the flowmeter 55 interposed between the valve 57a and the valve 57b. The one end of the raw material gas supply pipe 47 is inserted into the raw material container 41 from the top, such that a mixture gas of the ruthenium carbonyl gas generated inside the raw material container 41 and the CO gas is supplied into the processing container 1.

<CO Gas Supply Pipe>

One end of the CO gas supply pipe 49 is connected to the CO gas container 43 and the other end thereof is connected to the raw material container 41. In the CO gas supply pipe 49, there are installed a mass flow controller 59 configured to control a flow rate of the CO gas, and valves 61a and 61b which are respectively positioned at upstream and downstream sides in a gas flow direction with the mass flow controller 59 interposed between the valve 61a and the valve 61b. The other end of the CO gas supply pipe 49 is inserted into the raw material container 41 from the top, such that the CO gas as the carrier gas is introduced into the processing container 1. The CO gas as the carrier gas supplied from the CO gas container 43 is introduced into the raw material container 41 via the CO gas supply pipe 49, so that the ruthenium carbonyl is sublimated inside the raw material container 41 to generate the ruthenium carbonyl gas.

<Bypass Pipe>

The bypass pipe 51 is connected to both the raw material gas supply pipe 47 and the CO gas supply pipe 49. Specifically, one end of the bypass pipe 51 is connected to the CO gas supply pipe 49 at a position between the mass flow controller 59 and the downstream side valve 61b, and the other end thereof is connected to the raw material gas supply pipe 47 at a position between the upstream side valve 57a and the flowmeter 55. The bypass pipe 51 includes a valve 63 installed therein. Using the bypass pipe 51, it is possible to directly supply the CO gas from the CO gas container 43 into the processing container 1 via the raw material gas supply pipe 47.

<Dilution Gas Supply Pipe>

One end of the dilution gas supply pipe 53 is connected to the dilution gas container 45, and the other end thereof is connected to the middle of the raw material gas supply pipe 47. The dilution gas may be supplied into the processing container 1 via a series of the dilution gas supply pipe 53 and the raw material gas supply pipe 47. In the dilution gas supply pipe 53, there are installed a mass flow controller 65 configured to control a flow rate of the inert gas, and valves 67a and 67b which are respectively positioned at upstream and downstream sides in a gas flow direction with the mass flow controller 65 interposed between the valve 67a and the valve 67b.

<Raw Material Gas Supply Path>

The raw material gas supply pipe 47 constitutes a raw material gas supply path through which the mixture gas of the ruthenium carbonyl gas that is generated by introducing the CO gas as the carrier gas to the raw material container 41 and the CO gas, is guided into the processing container 1. Specifically, the CO gas as the carrier gas supplied from the CO gas container 43 is injected into the raw material container 41 via the CO gas supply pipe 49 so that the ruthenium carbonyl gas sublimated in the raw material container 41, while being carried by the CO gas, is supplied into the processing container 1 through the raw material gas supply pipe 47 as the raw material gas supply path and the shower head 20.

<CO Gas Supply Path>

A portion of the CO gas supply pipe 49, the bypass pipe 51 and a portion of the raw material gas supply pipe 47 constitute a CO gas supply path through which the CO gas supplied from the CO gas container 43 is directly introduced into the processing container 1 without passing through the raw material container 41. The term "a portion of the CO gas supply pipe 49" used herein means a section from a connection position with the CO gas container 43 up to a connection point with the bypass pipe 51 in the CO gas supply pipe 49. The term "a portion of the raw material gas supply pipe 47" used herein means a section from a connection point with the bypass pipe 51 up to a connection point with the gas inlet 21 of the shower head 20 in the raw material gas supply pipe 47.

In some embodiments, the gas supply part 40 may include devices such as a pipe, a valve and a mass flow controller, which are configured to supply, for example, a gas such as a hydrogen gas, a cleaning gas or the like other than the aforementioned gases, into the processing container 1. In FIG. 2, a hydrogen gas container 69a which stores a hydrogen gas and a hydrogen gas supply pipe 69b configured to supply the hydrogen gas into the processing container 1 are shown as a representative example by a virtual line.

In FIG. 2, the bypass pipe 51 is configured to allow the CO gas supplied from the CO gas container 43 to be introduced into the processing container 1 through the raw material gas supply pipe 47 without passing through the raw material container 41. A configuration of the pipe shown in FIG. 2 is an example, the present disclosure is not limited thereto. A configuration for supplying the CO gas into the processing container 1 without passing through the raw material container 41 may be modified in any other suitable manner. As an example, another CO gas supply source different from the CO gas container 43 may be installed so that the CO gas is supplied from the another CO gas supply source into the processing container 1 via a pipe.

<Controller>

Figure 3:
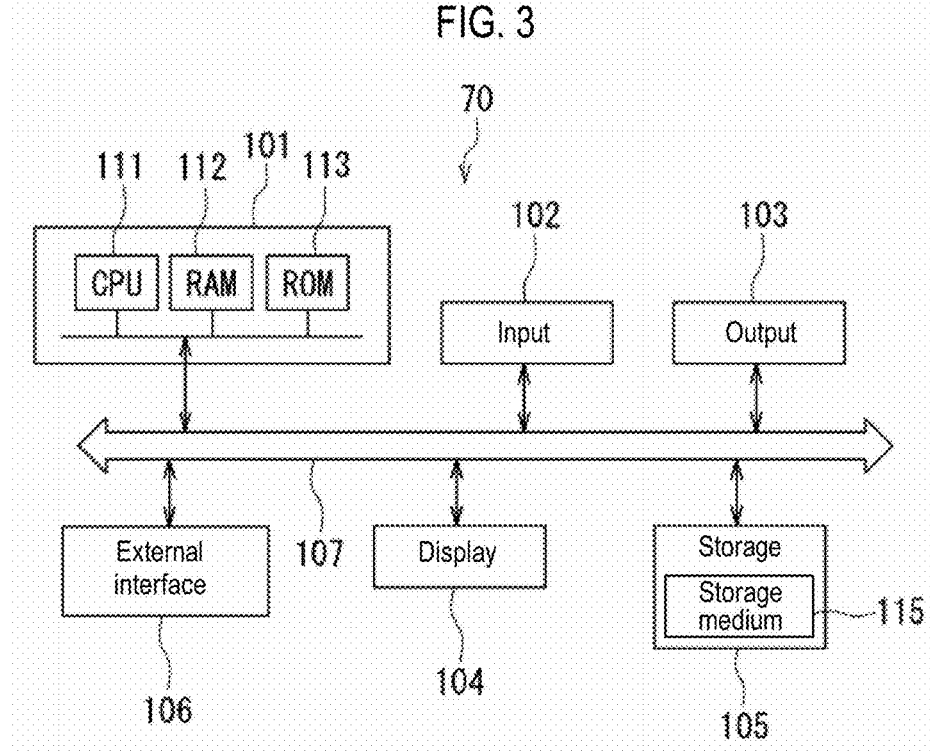
FIG. 3 is a block diagram showing an example of a hardware configuration of a controller of the metal nanodot formation apparatus shown in FIG. 1.

Respective components of the metal nanodot formation apparatus 100 are respectively controlled by the controller 70 connected thereto. Typically, the controller 90 is a computer. FIG. 3 shows an example of a hardware configuration of the controller 70 shown in FIG. 2. The controller 70 includes a main control part 101, an input device 102 such as a keyboard, a mouse or the like, an output device 103 such as a printer, a display device 104, a storage device 105, an external interface 106, and a bus 107 which interconnects these components. The main control part 101 includes a CPU (central processing unit) 111, a RAM (random access memory) 112 and a ROM (read only memory) 113. The storage device 105 may be formed in any shape as long as it can store information. An example of the storage device 105 may include a hard disc device or an optical disc device. Further, the storage device 105 is configured to write information in a computer-readable storage medium 115, and read out the information from the storage medium 115. The storage medium 115 may be formed in any shape as long as it can store the information. An example of the storage medium 115 may include a hard disc, an optical disc, a flash memory or the like. The storage medium 115 may be a recording medium storing a recipe of the metal nanodot formation method according to this embodiment.

In the controller 70, the CPU 111 is configured to execute a program stored in the ROM 113 or the storage device 105 using the RAM 112 as a working area, such that the metal nanodot formation apparatus 100 according to this embodiment performs a process on the wafer W. Specifically, the controller 70 controls the respective components of the metal nanodot formation apparatus 100 (the heater power source 15, the exhaust device 30, the gas supply part 40 and the like) which are related to process conditions such as a temperature of the wafer W, a process pressure, a gas flow rate and the like. For example, in the metal nanodot formation apparatus 100, the controller 70 is configured to control the gas supply part 40 such that the process gas such as the CO gas alone, the mixture gas of the CO gas and the ruthenium carbonyl gas, the dilution gas or the like is supplied into the processing container 1 at a predetermined timing, a predetermined flow rate and a predetermined flow rate ratio.

In some embodiments, the controller 70 may control the respective components of the metal nanodot formation apparatus 100 based on instructions provided from a higher-level controller (not shown). In this case, the higher-level controller may include a recording medium which stores a process recipe for executing a formation method described below. A Ru nanodot formation process of the metal nanodot formation apparatus 100 may be controlled according to the process recipe stored in such a recording medium.

<Ru Nanodot Formation Method>

Next, the Ru nanodot formation method which can be performed by the metal nanodot formation apparatus 100 will be described with reference to FIGS. 4 to 8.

First Embodiment

Figure 4:
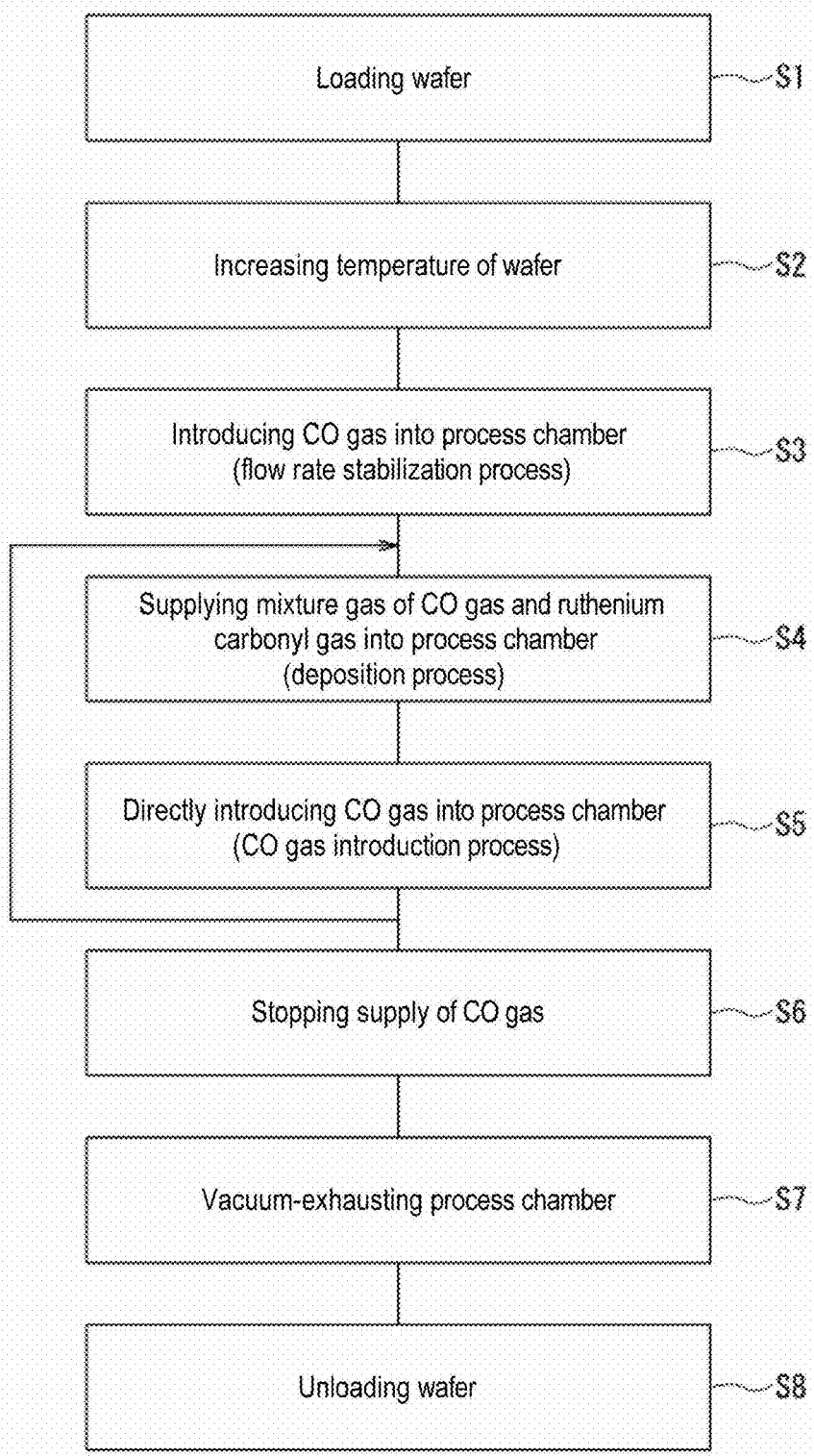
FIG. 4 is a flowchart showing an example of a sequence of a metal nanodot formation method according to a first embodiment of the present disclosure.

FIG. 4 is a flowchart showing an example of a sequence of the Ru nanodot formation method according to a first embodiment of present disclosure. As shown in FIG. 4, this method includes a sequence of steps S1 to S8.

<Step S1>

First, the gate valve GV is opened and the wafer W is loaded into the processing container 1 through the transfer port 3 so that the wafer W is mounted on the susceptor 10. In some embodiments, as a base film on which Ru nanodots are formed, for example, an insulation film such as an SiN film or an $SiO_2$ layer, a conductive film such polysilicon, a metal film or the like may be formed on a surface of the wafer W.

<Step S2>

The susceptor 10 has been heated, by the heater 13, up to a temperature ranging from 130 to 300 degrees C., in some embodiments, from 175 to 250 degrees C. so that the wafer W mounted on the susceptor 10 is also heated up to the same temperature. At this time, the interior of the processing container 1 is exhausted by the vacuum pump of the exhaust device 30 so that the internal pressure of the processing container 1 is vacuum-exhausted to a pressure of, e.g., $1.33 \times 10^{-3}$ Pa or less.

<Step S3>

Subsequently, the valves 61a, 63 and 57b are opened and the valves 61b and 57a are closed so that the CO gas supplied from the CO gas container 43 is introduced into the processing container 1 via a series of the CO gas supply pipe 49, the bypass pipe 51 and the raw material gas supply pipe 47. The CO gas continues to flow until a flow rate of the CO gas used as the carrier gas is stabilized (in a flow rate stabilization process).

<Step S4>

Upon the stabilization of the flow rate of the CO gas, the valve 63 is closed and the valves 61b and 57a are opened while maintaining the state of the flow rate stabilization process of Step S3. Specifically, the valves 61a and 61b and the valves 57a and 57b are opened, while the valve 63 is closed. In such a state, the CO gas as the carrier gas is injected into the raw material container 41 via the CO gas supply pipe 49. Inside the raw material container 41, the ruthenium carbonyl of a solid state is sublimated by heating of the heater 41a to generate the ruthenium carbonyl gas. The generated ruthenium carbonyl gas is carried by the CO gas to form the mixture gas of the CO gas and the ruthenium carbonyl gas, so that the mixture gas is introduced into the processing container 1 via the raw material gas supply pipe 47 and the shower head 20. Subsequently, on the surface of the wafer W, the ruthenium carbonyl gas is thermally decomposed by the following reaction equation (1), thus producing and depositing a metal ruthenium (Ru) (in a deposition process).

The deposition process suppresses the decomposition reaction of the ruthenium carbonyl gas expressed by the equation (1) using the CO gas as the carrier gas, which makes it possible to supply the raw material gas into the processing container 1 while maintaining a chemical structure of $Ru_3(CO)_{12}$ at maximum.

$$Ru_3(CO)_{12} \rightarrow 3Ru + 12CO \quad (1)$$

A flow rate of the CO gas used as the carrier gas may be, for example, 300 mL/min (sccm), and in some embodiments, 200 mL/min (sccm) or less. In some embodiments, a dilution gas may be contained in the mixture gas at a predetermined ratio. The internal pressure of the processing container 1 in the deposition process may fall within a range of, e.g., 0.7 to 133.3 Pa, and in some embodiments, 2 to 66.7 Pa.

<Step S5>

Subsequently, in the state of the deposition process of Step S4, the valves 61b and 57a are closed and the valve 63 is opened. Specifically, the valves 61a, 63 and 57a are opened, while the valves 61a and 57a are closed. In such a state, the CO gas supplied from the CO gas container 43 can be directly introduced into the processing container 1 via a series of the CO gas supply pipe 49, the bypass pipe 51 and the raw material gas supply pipe 47 without passing through the raw material container 41 (in a CO gas introduction process).

In this way, in the CO gas introduction process, the CO gas alone is introduced into the processing container 1 and is brought into contact with the metal ruthenium formed on the surface of the wafer W, so that CO molecules can be adsorbed onto surfaces of the metal ruthenium. It is presumed that adsorption (ad) and desorption reactions between $Ru_3(CO)_{12}$ and CO as represented by the following equations (2) and (3) take place on the surface of the wafer W.

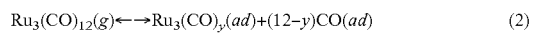

$$Ru_3(CO)_{12}(g) \leftrightarrow Ru_3(CO)_y(ad) + (12-y)CO(ad) \quad (2)$$

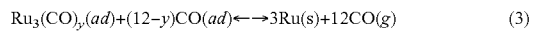

$$Ru_3(CO)_y(ad) + (12-y)CO(ad) \leftrightarrow 3Ru(s) + 12CO(g) \quad (3)$$

These reactions are equilibrium reactions. Thus, if the CO gas alone is supplied, for example, the reaction of the equation (3) easily proceeds to its left hand side (i.e., a direction in which $Ru_3(CO)_y(ad)$ and (12-y)CO(ad) are produced). Therefore, a time period for supplying only the CO gas is set after the deposition process such that a plurality of CO molecules is absorbed onto surfaces of nuclei of the metal ruthenium produced in the deposition process. As a result, growth of each of the nuclei of the metal ruthenium is restrained so that a plurality of nuclei having a relatively small size is formed. Ru nanodots, which are produced from such small nuclei whose growth are restrained, are formed on the surface of the base film with a substantially uniform distribution.

Although the deposition process of Step S4 and the CO gas introduction process of Step S5 may be performed once, they may be repeated a multiple number of times until each of the produced Ru nanodots has a predetermined size. The repetition of the deposition process of Step S4 and the CO gas introduction process of Step S5 is sometimes referred to as a "cycle formation." In such a cycle formation, the number of repetitions of the deposition process of Step S4 and the CO gas introduction process of Step S5 may be experimentally determined in advance depending on a target film thickness. Thus, the experimentally determined value may be set as, for example, a portion of the recipe. In some embodiments, in the sequence shown in FIG. 4, when the deposition process of Step S4 and the CO gas introduction process of Step S5 are repeatedly performed, the last Step S5 (the CO gas introduction process) may be omitted.

<Repetition Conditions>

Figure 5:
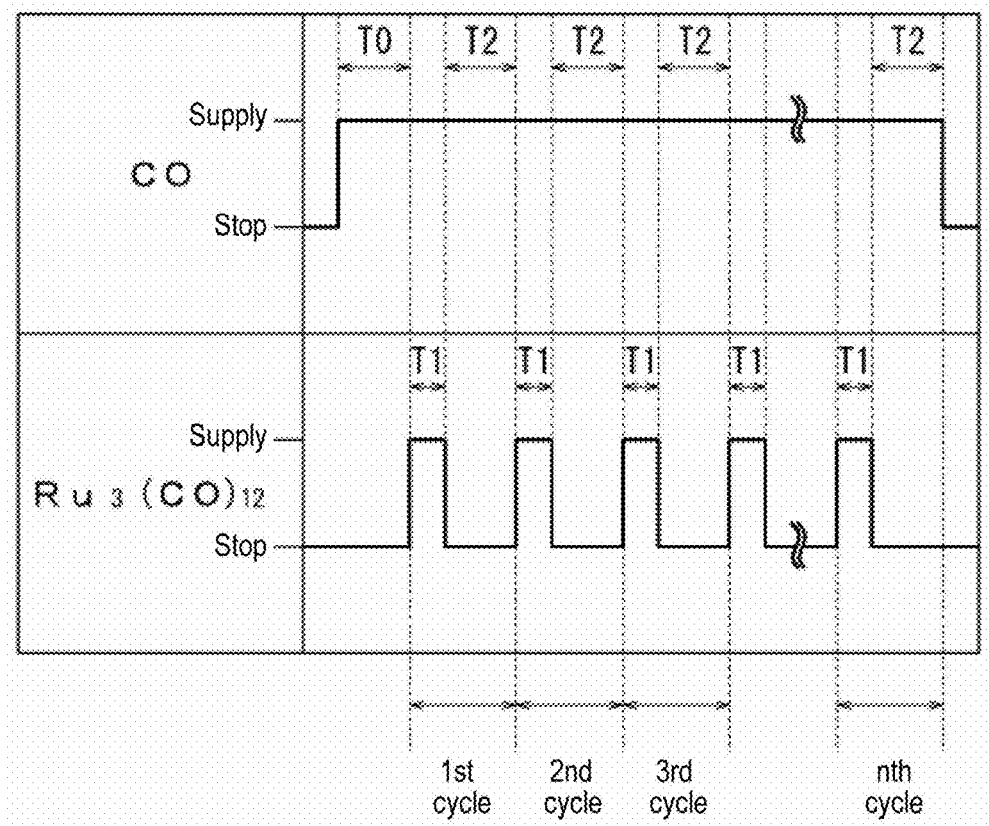
FIG. 5 is an example of a timing chart showing a sequence of supply and cutoff operations of a CO gas and a ruthenium carbonyl gas when a deposition process and a CO gas introduction process are repeated.
Figure 6:
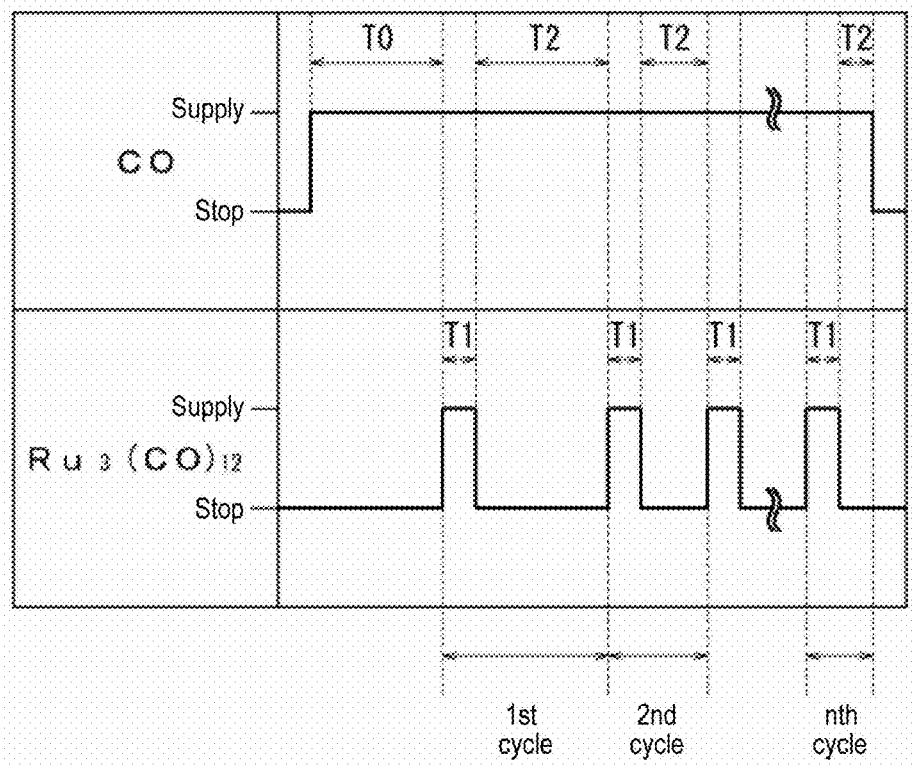
FIG. 6 is another example of a timing chart showing a sequence of supply and cutoff operations of a CO gas and a ruthenium carbonyl gas when a deposition process and a CO gas introduction process are repeated.

FIGS. 5 to 7 are timing charts showing timings of the supply and cutoff of the CO gas and the ruthenium carbonyl gas in the cycle formation. In FIGS. 5 to 7, T0 represents a time period of the flow rate stabilization process in which the CO gas alone is first introduced into the processing container 1 (i.e., Step S3 of FIG. 4). T1 represents a time period of the deposition process in which both the CO gas and the ruthenium carbonyl gas are introduced into the processing container 1 (i.e., Step S4 of FIG. 4). T2 represents a time period of the CO gas introduction process in which the growth of the metal ruthenium is suppressed (i.e., Step S5 of FIG. 4). In some embodiments, the time periods T1 and T2 may be repeated a predetermined number of times, for example, several cycles to several dozen cycles. FIGS. 5 and 6 illustrate cases in which a cycle including T1 and T2 is repeated n times. FIG. 7 shows a case in which the cycle including T1 and T2 is repeated 4 times.

FIG. 5 shows an example of the cycle formation in which the time periods of T1 and T2 are constant during the n-cycles starting from a first cycle. As shown in FIG. 5, T2 as the time period of the CO gas introduction process may be set to be longer than T1 as the time period of the deposition process. Such a relationship of T1<T2 allows the reaction expressed by the equation (3) to proceed to its left hand side (i.e., the direction in which $Ru_3(CO)_y(ad)$ and (12−y)CO(ad) are produced), which makes it possible to absorb a substantial amount of the CO molecules onto the surfaces of nuclei of the metal ruthenium produced in the deposition process. In this case, in some embodiments, T1 may be set to fall within a range of 1 to 10 sec and T2 may be set to fall within a range of 5 to 20 sec such that the relationship of T1<T2 is established. Alternatively, T1 may be set to fall within a range of 2 to 7 sec and T2 may be set to fall within a range of 5 to 15 sec such that the relationship of T1<T2 is established.

FIG. 6 shows an example in which the time period T1 is constant whereas the time period T2 is gradually shortened during the n-cycles starting from the first cycle. As described above, in order to form fine Ru nanodots using the CVD method, it is important that the substantial amount of CO molecules are absorbed onto the surfaces of nuclei of the metal ruthenium produced in the deposition process, thus suppressing the growth of each of the nuclei of the metal ruthenium. To address this, at the initial stage of the cycle formation including the n-cycles, it is effective that the time period T2 for the introduction of the CO gas is set to a substantial duration, thus suppressing the growth of the nuclei. Meanwhile, at the later stage of the cycle formation, the time period T2 for the introduction of the CO gas is set to be shortened such that a ratio of the time period T1 (the deposition process) to the time period T2 (the CO gas introduction process) is relatively increased. This is effective in shortening a time period of the Ru nanodot formation process. As shown in FIG. 6, the time period T2 is gradually decreased, which makes it possible to form fine Ru nanodots and to shorten the time period of the Ru nanodot formation process. In some embodiments, at the later stage of the cycle formation, the relationship of T1<T2 may be varied. Further, although in FIG. 6, the time period T2 has been described to be gradually decreased for every cycle, the time period T2 may be decreased for every multi-cycle in a stepwise manner.

FIG. 7 shows an example in which the time period T2 is constant whereas the time period T1 is increased for every two-cycle in a stepwise manner, when the first cycle to the nth cycle are repeated. In this case, at the initial stage of the cycle formation including the first to nth cycles, a ratio of the time period T2 (the CO gas introduction process) to the time period T1 (the deposition process) is set to be relatively increased so as to suppress growth of the nuclei, while at the later stage of the cycle formation, a ratio of T1 to T2 is set to be relatively increased. Thus, like the example of FIG. 6, it is possible to form fine Ru nanodots and to shorten a time period of the Ru nanodot formation process. Even in such a case, at the later stage of the cycle formation, the relationship of T1<T2 may be varied. Further, although in FIG. 7, the time period T1 has been described to be decreased for every two-cycles, the time period T1 may be gradually increased for every single cycle.

As described above, when the deposition process and the CO gas introduction process are repeated, the internal pressure of the processing container 1 may be kept at a constant level so as to control an average diameter of the Ru nanodots with high precision. To do this, the supply and cutoff of the CO gas and the ruthenium carbonyl gas may be switched, while keeping flow rates of these gases at a constant level.

For example, a shape of each of the Ru nanodots formed by the method according to this embodiment may be a semi-sphere shape. An example of the average diameter of the Ru nanodots may include 10 nm or less, a range of 2 to 8 nm, a range of 2 to 5 nm, or a range of 2 to 4 nm Here, the average diameter of the Ru nanodots can be calculated by averaging diameters of a certain number of (e.g., about twenty) Ru nanodots, which are obtained by observing the surface of the base film on which the Ru nanodots are formed, directly from the top, using a Scanning Electron Microscope (SEM) or a Transmission Electron Microscope (TEM). Further, if the shape of each of the Ru nanodots which are observed by the SEM-based method is, for example, an ellipse shape, a polygon shape or the like, other than the sphere shape, when viewed from the top, a length of the respective Ru nanodot in a longitudinal direction may be taken as its diameter.

<Step S6>

The valves 61, 61b and 57a are closed at a time when the Ru nanodots are formed with a predetermined size and density, so that the supply of the CO gas and the ruthenium carbonyl gas is stopped. If desired, the dilution gas as the purge gas supplied from the dilution gas container 45 may be introduced into the processing container 1 by opening the valves 67a and 67b such that the ruthenium carbonyl gas is purged.

<Step S7>

Subsequently, the exhaust device 30 is operated to vacuum-exhaust the interior of the processing container 1.

<Step S8>

Thereafter, the gate valve GV is opened and the wafer W is unloaded from the processing container 1 through the transfer port 3.

In this way, the Ru nanodot formation process for one sheet of the wafer W is completed.

In addition, in the cycle formation, the number of repetitions of the cycle including the deposition process (Step S4) and the CO gas instruction process (Step S5) may be registered in the recipe in advance, but may be determined according to the size or density of the formed Ru nanodots. As an example, the state of growth of the Ru nanodots is monitored using a detection means such as a laser scattering, a reflection ratio or the like. When the size or density of the Ru nanodots is determined to have reached the predetermined level, the repetition operation of the deposition process of Step S4 and the CO gas instruction process of Step S5 may be terminated.

As described above, according to the Ru nanodot formation method of this embodiment, it is possible to make the CO gas come into contact with the Ru nanodots (specifically, the nuclei of the metal rutheniums produced at the initial stage of the deposition process) formed on the wafer W by the CVD method, thus effectively suppressing the growth of the nuclei. As a result, it is possible to form Ru nanodots having a desired size from small nuclei whose growth is suppressed. For example, it is possible to form very fine Ru nanodots having an average diameter of 10 nm or less. In addition, the CO gas having the same component as the carrier gas can be used as a material for suppressing the growth of the nuclei. This eliminates the need to provide another equipment for supplying an additional material. The supply of the additional material may be implemented by switching only a respective valve in the gas supply part 40. Further, since the CO gas having the same component as the carrier gas can be used, concerns such as generation of by-products, incorporation of impurities into the Ru nanodots or the like are unlikely to occur.

Second Embodiment

FIG. 8 is a flowchart showing an example of a sequence of a Ru nanodot formation method according to a second embodiment of present disclosure. As shown in FIG. 8, this formation method includes a sequence of step S11 to step S20. In FIG. 8, since steps S11 to S16 and steps S19 and S20 of the second embodiment are similar to steps S1 to S6 and steps S7 and S8 of the first embodiment (see FIG. 4), duplicate descriptions for respective steps will be omitted. In other word, the sequence shown in FIG. 8 is different from the sequence of the first embodiment (see FIG. 4) in that the cycle including the deposition process of step S14 and the CO gas introduction process of step S15 is repeated if necessary, and subsequently, a hydrogen gas introduction process of step S17 is performed.

<Step S17>

Step S17 is the hydrogen gas introduction process of applying a hydrogen gas to the deposited Ru nanodots. The Ru nanodots formed on the wafer W are exposed to the hydrogen gas so that carbon atoms, oxygen atoms in the Ru nanodots and CO adsorbed on the surface of the wafer W are desorbed from each other, which makes it possible to improve purity of the metal ruthenium. Especially, since the carbon atoms are separated from the Ru nanodots by virtue of hydrogens, the carbon atoms are not segregated from the surfaces of the Ru nanodots and in the Ru nanodots so that the surfaces of the Ru nanodots is brought into a clear state.

In Step S17, in the metal nanodot formation apparatus 100, the hydrogen gas supplied from the hydrogen gas container 69a is introduced into the processing container 1 via the hydrogen gas supply pipe 69b (both the hydrogen gas container 69a and the hydrogen gas supply pipe 69b are depicted by the virtual line in FIG. 2) in a state where the valves 61a, 61b, 57a, 57b, and 63 are closed. And, in a state where a temperature of the wafer W is maintained in a range of, e.g., 150 to 250 degrees C., the hydrogen gas and the Ar gas as the dilution gas are introduced into the processing container 1 at a flow rate of 10 to 5,000 mL/min (sccm) and a flow rate of 0 to 1,000 mL/min (sccm), respectively. In some embodiments, an annealing process under an hydrogen atmosphere may be performed on the Ru nanodots in a state where a partial pressure of the hydrogen is about 4 to 1,333 Pa.

<Step S18>

After performing the hydrogen gas introduction process of step S17 for a predetermined period of time, in step S18, a valve (not shown) of the hydrogen gas supply pipe 69a is closed to cutoff the supply of the hydrogen gas.

The other configurations and effects in this embodiment are similar to those in the first embodiment.

EXAMPLES

Next, the results of experiments performed to confirm effects of the present disclosure will be described. First, a SiN film having a thickness of 500 nm was formed on a silicon wafer using a CVD method. Subsequently, Ru nanodots were formed on the SiN film by the CVD method, using ruthenium carbonyls as raw materials, according to the sequence of steps S1 to S8 shown in FIG. 4, through the use of the metal nanodot formation apparatus 100 which is similar to that shown in FIG. 2 in configuration. Formation conditions at this time are as follows:

<Common Condition>

Flow rate of carrier gas (CO gas): 300 mL/min(sccm)
Internal pressure of processing container: 66.7 Pa
Heating temperature of silicon wafer: 200 degrees C.

Condition 1 (Example)

Step S3 (flow rate stabilization process): 10 seconds
Step S4 (deposition process): 2 seconds
Step S5 (CO gas introduction process): 10 seconds
Where, these processes were repeated a total of 30 times until the total time of step S4 reaches 60 seconds.

Condition 2 (Comparative Example)

After step S3 (the flow rate stabilization process), step S4 (the deposition process) was successively performed for 60 seconds without performing step S5 (the CO gas introduction process).

Figure 10A:
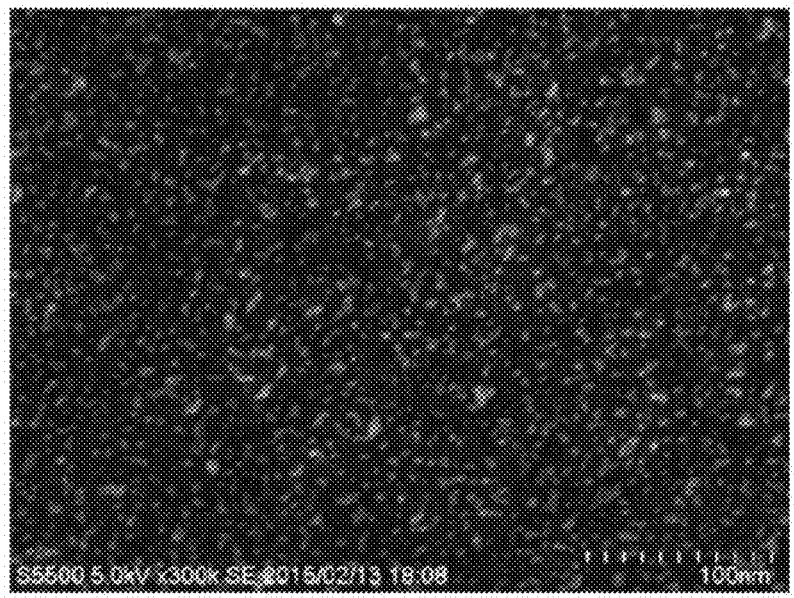
FIG. 10A is a SEM (scanning electron microscope) photograph of Ru nanodots formed in the Example of the present disclosure.
Figure 10B:
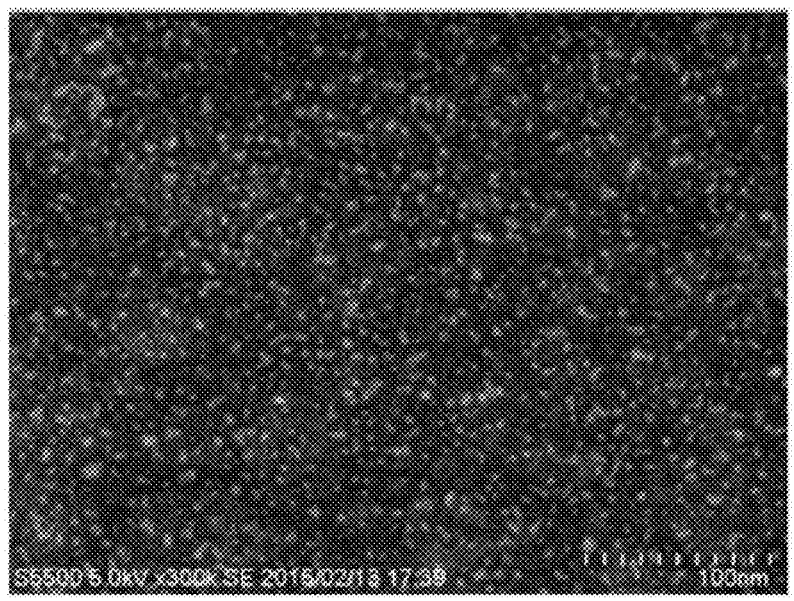
FIG. 10B is a SEM photograph of Ru nanodots formed in Comparative example.

Each of Ru nanodots obtained under the above conditions 1 and 2 was observed using the scanning electron microscope (SEM). The number (dot number) of the Ru nanodots existing in a certain number of (e.g., 12) areas of 100 nm×100 nm was measured to evaluate a variation. The evaluation result of the variation is shown in FIG. 9. In the condition 1 (Example) where the cycle formation is performed by repeating the cycle including the deposition process (step S4) and the CO gas instruction process (step 05), the variation in the dot number in the 12 areas was 4.1%, while in the condition 2 (Comparative example) where the deposition process (step S4) is successively performed, the variation was 13.6%. An SEM image of the Ru nanodots obtained under the condition 1 is shown in FIG. 10A, and an SEM image of the Ru nanodots obtained under the condition 2 is shown in FIG. 10B. Thus, the experiment shows that, through the cycle formation, the Ru nanodots having an average diameter of, e.g., 10 nm or less, can be formed on an insulation film with a substantially uniform distribution.

In this way, the metal nanodots obtained by the metal nanodot formation method according to this embodiment can be used in accumulating electric charges in a flash memory. Further, for example, the metal nanodots can be used in forming nuclei for metal plating, nano-catalyst particles for forming carbon nanotubes, a mask for forming nanowires, a nano-magnetic body or the like.

<Manufacturing Method of Semiconductor Device>

Figure 11:
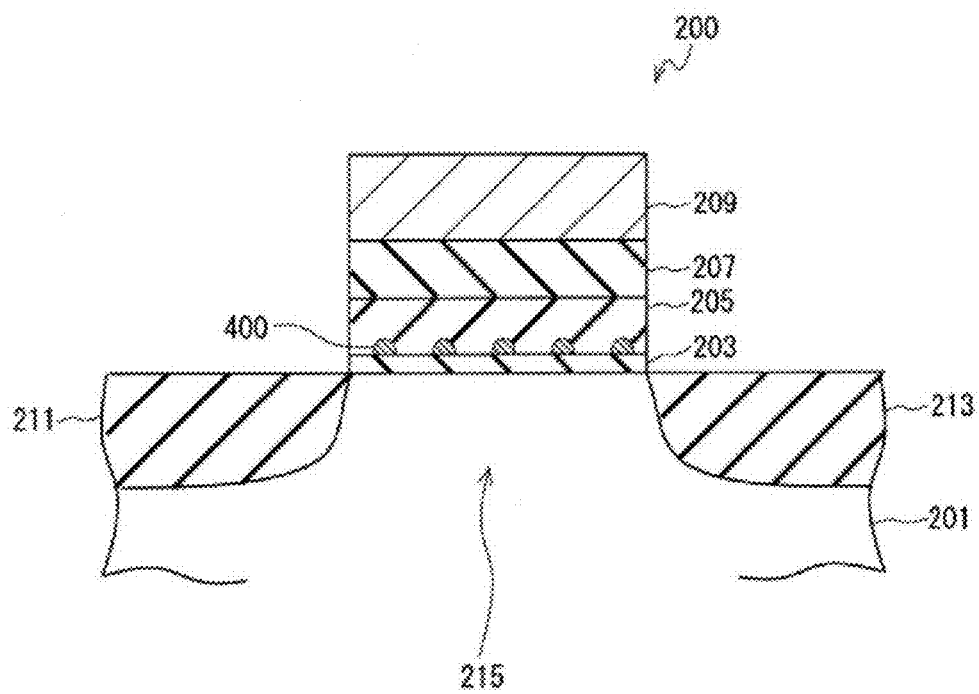
FIG. 11 is a view showing a schematic configuration of a non-volatile semiconductor memory device using metal nanodots.

Next, an example in which the metal nanodot formation method according to the above embodiment is applied in manufacturing a semiconductor device, will be described. This embodiment will be described with an example where an n-channel type non-volatile semiconductor memory device is used as the semiconductor device. FIG. 11 is a view showing a cross-sectional structure of a non-volatile semiconductor memory device 200. FIGS. 12 to 17 are views explaining a manufacturing process of the non-volatile semiconductor memory device 200.

First, a configuration of the non-volatile semiconductor memory device 200 as a flash memory will be described with reference to FIG. 11. The non-volatile semiconductor memory device 200 has a device structure in which a tunnel insulation film 203, a charge accumulation layer 205, an insulating layer 207 and an electrode layer 209 are formed on, for example, a p-type silicon substrate (Si substrate) 201, in that order. The charge accumulation layer 205 has a plurality of metal nanodots 400. In some embodiments, the non-volatile semiconductor memory device 200 may be formed on a p-well or p-type silicon layer in a semiconductor substrate.

For example, the tunnel insulation film 203 is an $SiO_2$ film or an SiON film.

The charge accumulation layer 205 is composed of a dielectric material. An example of the dielectric materials may include $SiO_2$, SiN, SiON, or a High-k material such as HfSiO (Hafnium Silicate). In addition, the charge accumulation layer 205 has the plurality of metal nanodots 400 formed on the tunnel insulation film 203. In the charge accumulation layer 205, the metal nanodots 400 are embedded and surrounded by the dielectric material. The charge accumulation layer 205 including the metal nanodots 400 functions as a floating gate.

The insulating layer 207 is, for example, a $SiO_2$ film formed by the CVD method, which functions as a block layer (a barrier layer) between the electrode layer 209 and the charge accumulation layer 205.

The electrode layer 209 is composed of, for example, a polycrystalline silicon film formed by the CVD method, which functions as a control gate (CG) electrode. Further, the electrode layer 209 may be a metal film containing metal such as W, Ti, Ta, Cu, Al, Au or the like. The electrode layer 209 is not limited to a single layer. In some embodiments, the electrode layer 209 may be configured to have a stack structure including, for example, tungsten, molybdenum, tantalum, titanium, silicide, nitride, alloy and the like which are obtained by these material, for the purpose of lowering resistivity of the electrode layer 209 to achieve an increase in speed thereof. The electrode layer 209 is connected to a wiring layer (not shown).

In the Si substrate 201, an active region on which the non-volatile semiconductor memory device 200 is formed is defined by a device isolation film (not shown). A source region 211 and a drain region 213 are formed around the device structure of the Si substrate 201. Inside the active region, a portion defined between the source region 211 and the drain region 213 corresponds to a channel formation region 215 of the non-volatile semiconductor memory device 200. In addition, although not shown in FIG. 11, sidewalls may be formed at both sides of the device structure.

Next, an example of an operation of the non-volatile semiconductor memory device 200 configured as above will be described. First, at the time of writing data, the source region 211 and the drain region 213 are maintained at 0V based on a potential of the Si substrate 201, and a positive voltage of a predetermined level is applied to the electrode layer 209. At this time, electrons are accumulated in the channel formation region 215 to form an inversion layer. Some of the electrons in the inversion layer move to the charge accumulation layer 205 through the tunnel insulation film 203 by a tunnel effect. The electrons moved to the charge accumulation layer 205 are accommodated on the plurality of metal nanodots 400 formed in the charge accumulation layer 205, so the storing of data is performed.

At the time of reading out data, a voltage of 0V is applied to one of the source region 211 and the drain region 213 with reference to the potential of the Si substrate 201, and a predetermined voltage is applied to the other of the source region 211 and the drain region 213. Also, a predetermined voltage is applied at the electrode layer 209. The application of such voltages varies the presence or absence of the electrons accumulated in the charge accumulation layer 205, or an amount of current flowing through the channel or a drain voltage, according to the accumulated amount of the electrons. It is therefore possible to detect a change in the channel current or the drain voltage, thus reading out the stored data to the outside.

At the time of erasing data, the voltage of 0V is applied to both of the source region 211 and the drain region 213 with reference to the potential of the Si substrate 201, and a negative voltage of a predetermined level is applied to the electrode layer 209. The application of such voltages allows the electrons held in the charge accumulation layer 205 to be drawn toward the channel formation region 215 through the tunnel insulation film 203. In this way, the non-volatile semiconductor memory device 200 returns to an erased state in which the amount of electrons accumulated in the charge accumulation layer 205 is small.

Next, a manufacturing method of the non-volatile semiconductor memory device 200 will be described with reference to FIGS. 12 to 17. First, although not shown in figures, according to the conventional method, a device isolation process is performed on the Si substrate 201 using a method such as an STI (Shallow Trench Isolation) method or the like. In some embodiments, an impurity doping process may be performed using an ion implantation method or the like to adjust a threshold voltage of the non-volatile semiconductor memory device 200.

Figure 12:
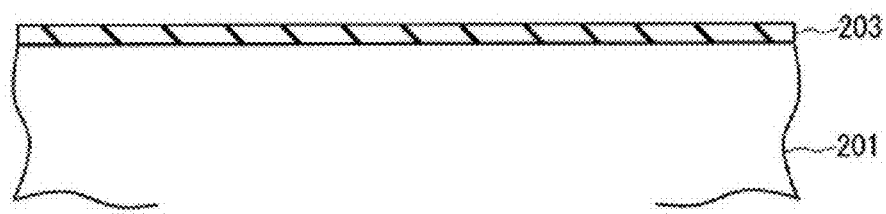
FIG. 12 is a view showing a manufacturing process of the non-volatile semiconductor memory device shown in FIG. 11.

Subsequently, as shown in FIG. 12, the tunnel insulation film 203 is formed on the surface of the active region of the Si substrate 201 by, for example, a thermal oxidation method. In some embodiments, a silicon oxynitride film (SiON film) may be formed by nitriding a surface of a silicon dioxide film, if necessary.

Figure 13:
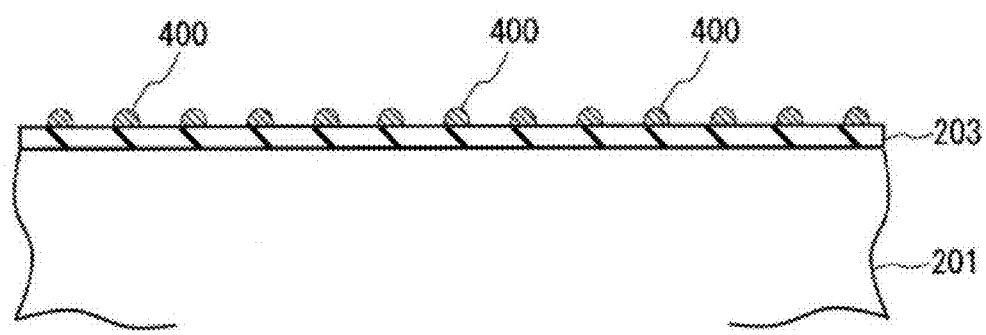
FIG. 13 is a view showing a process following the process shown in FIG. 12.

Thereafter, as shown in FIG. 13, the plurality of fine metal nanodots 400 is formed on the tunnel insulation film 203 by the CVD method, according to the metal nanodot formation method of the above embodiment. According to the metal nanodot formation method of the above embodiment, it is possible to form the fine metal nanodots 400 with a substantially uniform distribution. By accumulating electric charges in the metal nanodots 400, the electric charges are hardly drawn out, which makes it possible to reduce a data leak problem.

Figure 14:
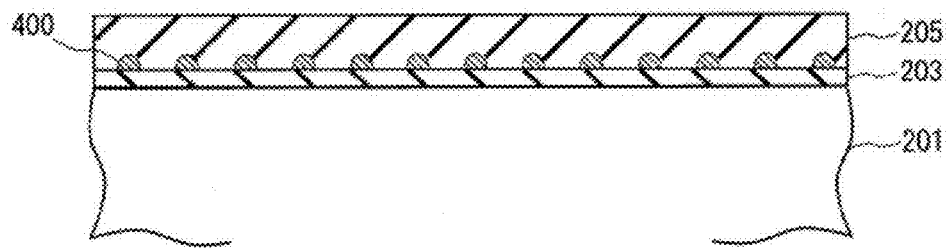
FIG. 14 is a view showing a process following the process shown in FIG. 13.

Subsequently, as shown in FIG. 14, for example, dielectric materials are deposited on the tunnel insulation film 203 using the CVD method, such that the charge accumulation layer 205 which covers the metal nanodots 400 is formed.

Figure 15:
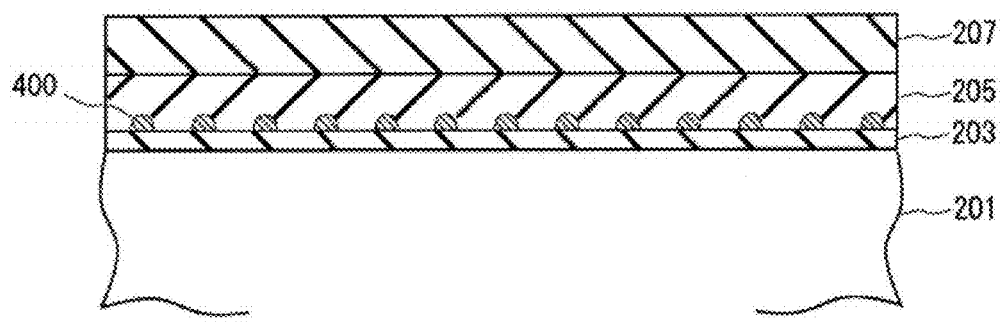
FIG. 15 is a view showing a process following the process shown in FIG. 14.

Thereafter, as shown in FIG. 15, the insulating layer 207 is formed on the charge accumulation layer 205. The insulating layer 207 may be formed by the thermal oxidation method or the CVD method.

Figure 16:
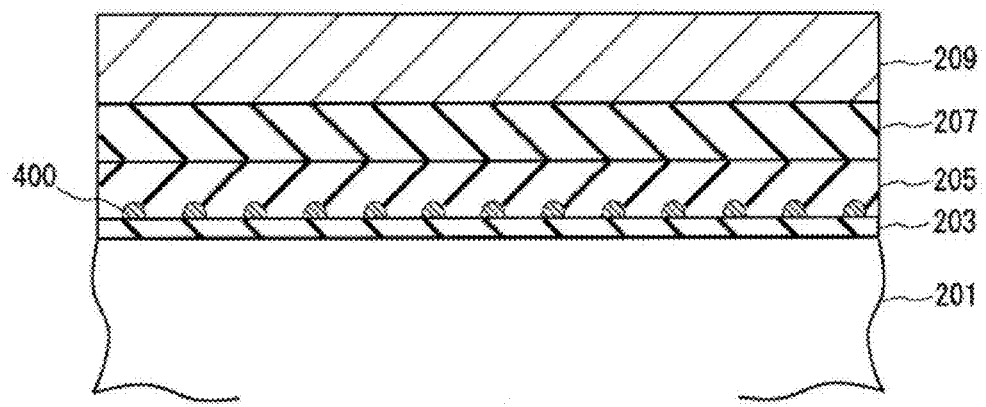
FIG. 16 is a view showing a process following the process shown in FIG. 15.

Subsequently, as shown in FIG. 16, for example, a polysilicon, metal, metal silicide or the like is deposited on the insulating layer 207 by the CVD method to form the electrode layer 209.

Figure 17:
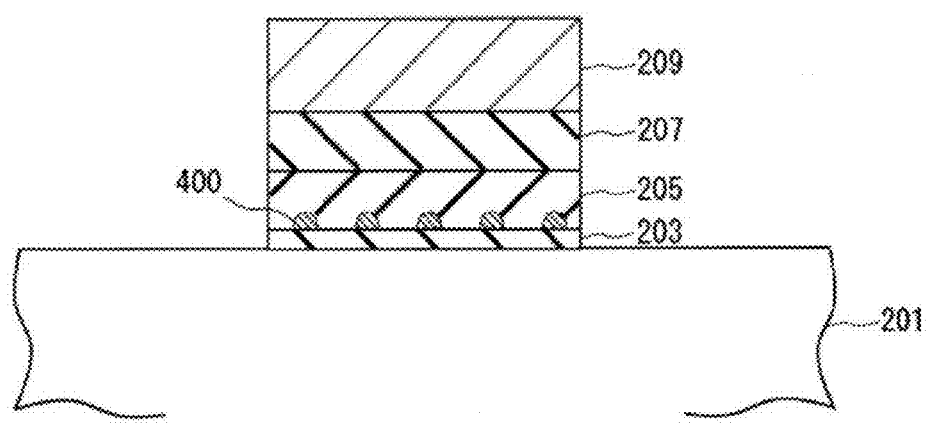
FIG. 17 is a view showing a process following the process shown in FIG. 16.

Thereafter, through a photolithography technique, the electrode layer 209, the insulating layer 207, the charge accumulation layer 205 and the tunnel insulation film 203 are sequentially etched using a patterned resist as a mask. In this way, as shown in FIG. 17, a patterned stack structure composed of the electrode layer 209, the insulating layer 207, the charge accumulation layer 205 and the tunnel insulation film 203 is obtained.

Subsequently, sidewalls (not shown) are formed, and n-type impurities are ion-implanted into silicon of the active region with high concentration so that the source region 211 and the drain region 213 are formed. In this way, the non-volatile semiconductor memory device 200 having the structure shown in FIG. 11 is manufactured.

While in the above embodiments, the n-channel type non-volatile semiconductor memory device 200 has been described as an example, a p-channel type semiconductor memory device in which a conductive type of impurity is reversed may be used. In addition, while in the structure shown in FIG. 11, the charge accumulation layer 205 having the plurality of metal nanodots 400 has been described to be formed as a single layer, the present disclosure is not limited thereto. In some embodiments, a plurality of charge accumulation layers may be stacked with an insulating layer interposed between the charge accumulation layers. Further, in the above embodiments, the non-volatile semiconductor memory device 200 has been described to be configured as a single level cell (SLC), but may be configured as a multi level cell (MLC) or a triple level cell (TLC).

Since the metal nanodot formation method according this embodiment has good step coverage, it is possible to form the metal nanodots even if the base film is vertically (longitudinally) formed with respect to the wafer W. For this reason, the metal nanodot formation method according this embodiment may be applied in manufacturing, for example, a semiconductor memory device of 3-dimensional structure.

Figure 18:
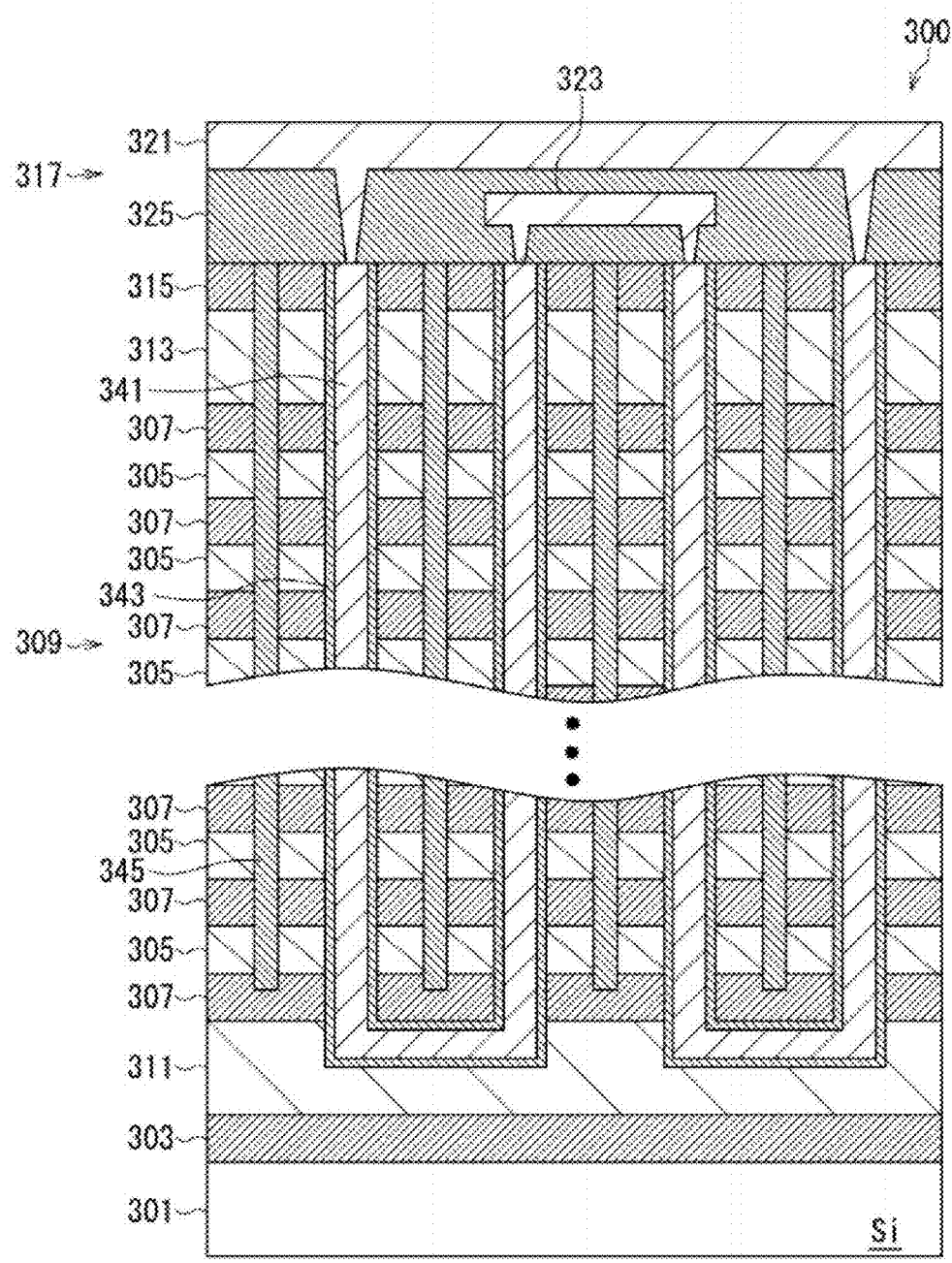
FIG. 18 is a view showing a schematic configuration of another non-volatile semiconductor memory device using metal nanodots.

FIG. 18 is a partial cross-sectional view schematically showing a memory cell array of a NAND type flash memory of 3-dimensional structure. FIG. 19 is an enlarged sectional view of main parts of the NAND type flash memory. An interlayer dielectric film 303 is formed on an Si substrate 301. A memory cell array 300 is formed on the interlayer dielectric film 303.

The memory cell array 300 includes a stack structure 309 in which a plate type electrode 305 as a control gate electrode and an insulating layer 307 are alternately and repeatedly stacked in a direction perpendicular to the top surface of the Si substrate 301. The plate type electrode 305 may be composed of a conductive material such as polysilicon or the like. The insulating layer 307 may be composed of an insulating material such as $SiO_2$, SiN, SiON or the like. The plate type electrode 305 and the insulating layer 307 may be alternately stacked in the form of, e.g., several tens of layers.

In addition, the memory cell array 300 includes a back gate electrode 311 formed on interlayer dielectric film 303. A plurality of NAND strings is arranged and formed on the back gate electrode 311 in a direction parallel to the surface of the Si substrate 301.

Further, the memory cell array 300 includes a selective gate electrode 313 formed on the stack structure 309, and a wiring portion 317 stacked on the selective gate electrode 313 via an insulating layer 315. The wiring portion 317 includes a bit line 321, a source line 323 and an insulation film 325.

Further, the memory cell array 300 includes polysilicon pillars 341 piercing through the selective gate electrode 313 and the stack structure 309 in a longitudinal direction, and insulation film stack bodies 343 which cover peripheries of the respective polysilicon pillars 341. Lower portions of two adjacent polysilicon pillars 341 are positioned to reach the back gate electrode 311 where they are connected to each other in a U-shape. An upper end of one of the two adjacent polysilicon pillars 341 is connected to the bit line 321, and an upper end of the other of the two adjacent polysilicon pillars 341 is connected to the source line 323. The adjacent polysilicon pillars 341 are insulated from each other by respective insulating portions 345. In some embodiments, each of the polysilicon pillars 341 may be formed in a hollow structure.

As shown in the enlarged sectional view of FIG. 19, the insulation film stack body 343 includes a tunnel insulation film 351 formed adjacent to the polysilicon pillar 341, a charge accumulation layer 353 which covers the tunnel insulation film 351, and a block insulating layer 355 formed between the charge accumulation layer 353 and the plate type electrode 305. The charge accumulation layer 353 is composed of a dielectric material. An example of the dielectric material may include $SiO_2$, SiN, SiON, or a high-k material such as HfSiO (Hafnium Silicate) or the like. Further, the plurality of metal nanodots 400 are formed in the charge accumulation layer 353. In such a structure, memory cells are respectively formed between the plate type electrodes 305 and the polysilicon pillars 341. As described above, the upper end of one of the two adjacent polysilicon pillars 341 is connected to the bit line 321 and the upper end of the other of the two adjacent polysilicon pillars 341 is connected to the source line 323, so that a string of the memory cell of a substantial U-shape is formed between the bit line 321 and the source line 323. In addition, a selective transistor is formed between the selective gate electrode 313 and the polysilicon pillar 341.

By applying the metal nanodot formation method according to this embodiment in manufacturing the NAND type flash memory of 3-dimensional structure configured as above, it is possible to form the plurality of fine metal nanodots 400 on a surface of the block insulating layer 355 with a substantially uniform distribution in a direction perpendicular to the surface of the Si substrate 301. Further, by accumulating electric charges in the plurality of metal nanodots 400, the electric charges are hardly drawn from the charge accumulation layer 353, which makes it possible to reduce a data leak problem. Further, the structure of the memory cell array 300 shown in FIG. 18 is described only by way of illustration. In some embodiments, the metal nanodot formation method according to this embodiment may be applied to a NAND type flash memory of another 3-dimensional structure.

While different embodiments have been described above, the present invention is not limited to these embodiments but may be configured in many modified forms. As an example, while in the above embodiments, the Ru nanodots have been described by way of example, the present disclosure may be applied to metal nanodots composed of another metal species. Also, the configuration of the apparatus used in the above embodiments has been described only by way of example, apparatuses having other various configurations may be used.

Further, a structure of the device described herein is not limited to the above embodiments.

Furthermore, the target substrate is not limited to the semiconductor wafer.

According to the metal nanodot formation method and the metal nanodot formation apparatus of the present disclosure, it is possible to two-dimensionally form very fine metal nanodots having an average diameter of, e.g., 10 nm or less, with a substantially uniform distribution using a CVD method. In addition, according to the semiconductor device manufacturing method of the present disclosure, it is possible to manufacture a semiconductor device which can be adapted for miniaturization and has high reliability.

While certain embodiments have been described, these embodiments have been presented by way of example only, and are not intended to limit the scope of the disclosures.

Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A metal nanodot formation method, comprising:
   loading a target substrate inside a processing container of a processing apparatus;
   depositing a plurality of metal nanodots on a surface of the target substrate by a sequence of: supplying a CO gas from a CO gas container which stores the CO gas as a carrier gas into a raw material container which stores a metal carbonyl compound as a solid raw material; generating gas of the metal carbonyl compound; introducing the generated gas of the metal carbonyl compound as a mixture gas containing the CO gas into the processing container; and decomposing the metal carbonyl compound on the target substrate,
   directly introducing the CO gas from the CO gas container into the processing container, in a state where the introduction of the mixture gas into the processing container is stopped, such that the CO gas is brought into contact with the metal nanodots on the surface of the target substrate, and
   repeating the depositing and the directly introducing,
   wherein at least one of a process time for each act of the depositing and a process time for each act of the directly introducing is changed as the number of repetitions of the depositing and the directly introducing increases.

2. The method of claim 1, wherein, the process time for each act of the depositing is less than the process time for each act of the directly introducing.

3. The method of claim 1, further comprising: after the depositing and the directly introducing are repeated the multiple number of times, introducing a hydrogen gas into the processing container such that the hydrogen gas is brought into contact with the metal nanodots on the surface of the target substrate.

4. The method of claim 1, wherein, the process time for each act of the directly introducing is changed to be shortened as the number of repetitions of the depositing and the directly introducing increases.

5. The method of claim 1, wherein, the process time for each act of the depositing is changed to be lengthened as the number of repetitions of the depositing and the directly introducing increases.

6. The method of claim 1, wherein an average diameter of the metal nanodots is 10 nm or less.

7. The method of claim 1, wherein the metal carbonyl compound is a triruthenium dodecacarbonyl [$Ru_3(CO)_{12}$], and the metal nanodots are ruthenium nanodots.

8. A method for manufacturing a semiconductor device, comprising
   forming metal nanodots using the metal nanodot formation method of claim 1.

9. The method of claim 8, wherein the semiconductor device is a semiconductor memory device which includes:
   a tunnel insulation film, and
   one or plural charge accumulation layers stacked on the tunnel insulation film and having a plurality of the metal nanodots.

* * * * *